United States Patent
Chen et al.

(10) Patent No.: US 8,324,692 B2
(45) Date of Patent: Dec. 4, 2012

(54) INTEGRATED INDUCTOR

(75) Inventors: Zhen Chen, Shanghai (CN); Yung Feng Lin, Shanghai (CN); Lin Huang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 12/953,426

(22) Filed: Nov. 23, 2010
(Under 37 CFR 1.47)

(65) Prior Publication Data
US 2011/0304013 A1    Dec. 15, 2011

(30) Foreign Application Priority Data

Dec. 4, 2009 (CN) .......................... 2009 1 0199994

(51) Int. Cl.
*H01L 27/11* (2006.01)
(52) U.S. Cl. ........ 257/379; 275/516; 275/528; 275/531; 275/277; 275/758; 275/904; 275/E21.022; 438/381
(58) Field of Classification Search ................. 257/277, 257/758, E21.022, 379, 516, 528, 531–537, 257/904; 438/381
See application file for complete search history.

(56) References Cited

U.S. PATENT DOCUMENTS

| | | | |
|---|---|---|---|
| 5,656,849 A | 8/1997 | Burghartz et al. | |
| 5,793,272 A | 8/1998 | Burghartz et al. | |
| 5,884,990 A | 3/1999 | Burghartz et al. | |
| 5,936,299 A | 8/1999 | Burghartz et al. | |
| 6,114,937 A | 9/2000 | Burghartz et al. | |
| 6,140,197 A * | 10/2000 | Chu et al. | 438/381 |
| 6,274,920 B1 * | 8/2001 | Park et al. | 257/531 |
| 6,285,069 B1 * | 9/2001 | Yoshida | 257/531 |
| 6,472,257 B2 * | 10/2002 | Ferrari et al. | 438/171 |
| 6,720,229 B2 * | 4/2004 | Norstrom et al. | 438/381 |
| 2006/0001124 A1 * | 1/2006 | Ayazi et al. | 257/531 |
| 2009/0057824 A1 * | 3/2009 | Kwak | 257/531 |
| 2009/0283854 A1 * | 11/2009 | Levy et al. | 257/531 |

FOREIGN PATENT DOCUMENTS

CN 1334594 A 2/2002

* cited by examiner

*Primary Examiner* — Andy Huynh
*Assistant Examiner* — Cuong Nguyen
(74) *Attorney, Agent, or Firm* — Kilpatrick Townsend & Stockton LLP

(57) ABSTRACT

A method of fabricating an integrated inductor device includes providing a silicon substrate and forming a thickness of an insulating layer overlying the silicon substrate. The insulating layer includes a dummy structure within a portion of the thickness. The method includes forming an inductor having a first portion and a second portion. The first portion includes a spiral coil of conductor lines. The method also includes exposing the dummy structure by forming an opening in the insulating layer and removing the dummy structure to form a cavity underlying the inductor to reduce a dielectric constant and to increase a Q value of the inductor. The method includes using aluminum or copper for the dummy structures. The method includes dry etching the insulator and wet etching the dummy structure. The method also includes forming the inductors using aluminum or copper.

12 Claims, 8 Drawing Sheets

INTEGRATED INDUCTOR

CROSS-REFERENCES TO RELATED APPLICATIONS

This application claims priority to Chinese Patent Application No. 200910199994.3, filed Dec. 4, 2009, commonly assigned and the content of which is incorporated herein by reference in its entirety.

BACKGROUND OF THE INVENTION

The present invention is directed to integrated circuits and their processing for the manufacture of semiconductor devices. More particularly, the invention provides a method and device for an integrated inductor having an underlying cavity to reduce parasitic capacitance. Merely by way of example, the invention has been applied to forming a high Q inductor on a silicon substrate. But it would be recognized that the invention has a much broader range of applicability. For example, the invention can be applied to integrated circuits including CMOS devices, SOI devices, bipolar devices, or BiCMOS devices, or other integrated circuit substrates such as compound semiconductors.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed.

Fabrication of custom integrated circuits using chip foundry services has evolved over the years. Fabless chip companies often design the custom integrated circuits. Such custom integrated circuits require a set of custom masks commonly called "reticles" to be manufactured. A chip foundry company called Semiconductor Manufacturing International Corporation (SMIC) of Shanghai, China is an example of a chip company that performs foundry services. Although fabless chip companies and foundry services have increased through the years, many limitations still exist.

As semiconductor device feature size continues to scale down to nanometer ranges and approaches scaling limits for integrated circuits, analog and mixed signal processes are also being included in advanced integrated circuit. With increased demand for wireless and other communication applications, passive device elements are also integrated on semiconductor chips. For example, inductors are widely used in RF integrated circuits. As is known, high performance inductors are critical to circuit designers. FIG. 1a is a top-view diagram of a conventional integrated circuit inductor device 100. FIG. 1b is a cross-sectional view diagram of the conventional integrated circuit inductor device 100. As shown, inductor 100 includes a spiral structure 140 and an underpass conductor 130, interconnected through a via 135. The inductor is formed on an insulating layer 120 overlying a silicon substrate 110.

Inductors are used in radio frequency (RF) and microwave circuitry including oscillators, amplifiers, and matching networks. Discrete inductors incur high parasitic capacitance and resistance when placed in a printed circuit board to connect with an integrated circuit. Discrete inductors also have high unit cost and high assembly cost. Hence, it is desirable to fabricate inductor on-chip. Quality factor Q is one of major characteristics of inductors. Quality factor Q is defined as $\omega L/R$, where $\omega$ is the operating frequency of the inductor, L is the inductance, and R is the resistance of the inductor. As the operating frequency is a function of $1/\sqrt{LC}$, the quality factor $Q=1/R \; (\sqrt{(L/C)})$. For a given inductance value L, an inductor with a high Q can be designed with a relatively smaller area by reducing the capacitance and resistance. Traditionally, on-chip inductors are prevented from attaining high Q due to the following factors: (1) conductance loss; (2) substrate loss; and (3) radiation loss. Among these, substrate loss is the most important factor, which is caused by the parasitic capacitance between inductor and substrate.

From the above, it is seen that an improved technique for reducing parasitic capacitance and for obtaining high Q integrated inductors is desired.

BRIEF SUMMARY OF THE INVENTION

According to the present invention, techniques directed to integrated circuits and their processing are provided for the manufacture of semiconductor devices. More particularly, embodiments of the present invention provide methods of manufacturing an integrated inductor having an underlying cavity to reduce parasitic capacitance. Merely by way of example, embodiments of the present invention have been applied to forming a high Q inductor on a silicon substrate. But it would be recognized that the invention has a much broader range of applicability. For example, the invention can be applied to integrated circuits including CMOS devices, SOI devices, bipolar devices, or BiCMOS devices. The invention can also be applied to reducing parasitic capacitance of other circuit elements such as interconnect structures. Moreover, the invention can also be used with other integrated circuit substrates such as compound semiconductors.

In a specific embodiment of the invention, a method is provided for fabricating an integrated inductor device. The method includes providing a silicon substrate and forming an insulating layer overlying the silicon substrate. The insulating layer having a thickness and includes a dummy structure within a portion of the thickness. The method includes forming an inductor overlying a region of the insulating layer and overlying the dummy structure. The inductor has a first portion and a second portion. The first portion includes a coil of conductor lines. In an embodiment, the dummy structure has a thickness ranging from about 0.5 micron to about 2 microns. The method also includes removing the dummy structure to form a cavity underlying the inductor to reduce a dielectric constant to ranging from about 4 to 1 to increase a Q value of the inductor. The cavity is surrounded by a portion of the insulating layer. In a specific embodiment, the forming of the inductor includes forming a coil having 3 to 5 turns of the conductor line. In an embodiment, the forming of the inductor includes forming metal lines characterized by a width of about 10 to 30 microns. In some embodiments, the substrate further comprises CMOS devices, SOI devices, bipolar devices, or BiCMOS devices. In some embodiments, the substrate further comprises oscillators, cellular transceiver devices, wireless 802.11 devices, WiMAX devices, or others. In a specific embodiment, the dummy structure includes a metal material. In an embodiment, the dummy structure includes aluminum. In another embodiment, the dummy structure includes copper. In a specific embodiment, the removing of the dummy structure further includes forming a cavity through a center portion of the inductor coil. In an embodiment, the removing of the dummy structure further includes dry etching of the insulator and wet etching the dummy structure. In a specific embodiment, the removing of the dummy structure further includes using oxidant, acid, and chelator to remove the dummy structure.

In an alternative embodiment, the present invention provides a method of fabricating an integrated inductor device. The method includes providing a silicon substrate and forming a thickness of an insulating layer including a dummy structure within a portion of the thickness of the insulating layer overlying the silicon substrate. The method includes forming an inductor overlying a region of the insulating layer and overlying the dummy structure. The inductor has a first portion and a second portion. In an embodiment, the first portion includes a copper coil, and the second portion includes a conductor. The method also includes adding a first passivation layer and adding a second passivation layer. The method further includes removing the dummy structure to form a cavity underlying the inductor to reduce a dielectric constant ranging from about 4 to about 1 to increase a Q value of the inductor. The cavity is surrounded by a portion of the insulating layer. In a specific embodiment, the cavity includes an opening in the insulator layer through a center portion of the coil and the cavity further includes a plurality of interconnected chambers formed within the insulator layer. In an embodiment, the substrate includes CMOS devices, SOI devices, bipolar devices, or BiCMOS devices.

In yet another embodiment, the present invention provides an integrated inductor, which includes, in part, a silicon substrate and an insulating layer overlying the silicon substrate, the insulating layer having a thickness. The inductor includes, in part, a first portion having a spiral coil overlying a region of the insulating layer and a second portion. The first portion is connected with the second portion through a via. The inductor includes a cavity within a portion of the thickness of the insulating layer and underlying the inductor. In an embodiment, the cavity is configured to reduce a dielectric constant ranging from about 4 to about 1 to increase a Q value of the inductor. In a specific embodiment, the inductor includes a coil having 3 to 5 turns of a metal line. In an embodiment, the inductor includes metal lines characterized by a width of about 10 to 30 microns. In certain embodiments, the substrate further includes CMOS devices, SOI devices, bipolar devices, or BiCMOS devices. In some embodiments, the substrate may include oscillators, phase-locked loop circuits, wireless 802.11 devices, or WiMAX devices. In a specific embodiment, the cavity may include an opening in the insulating layer through a center portion of the coil and a plurality of interconnected cavities in the insulating layer. In some embodiments, the cavity includes an opening in the insulator layer and a plurality of interconnected chambers in the insulator layer. According to a specific embodiment, the cavity is formed after the formation of the inductor. In an embodiment, the cavity is formed by removing a portion of the insulating layer and removing a dummy structure formed within a portion of the thickness of the insulating layer.

Numerous benefits are achieved using one or more features of the present invention. In a specific embodiment, the present invention provides a method for forming a high performance integrated circuit inductor having reduced parasitic capacitance and a high Q factor. In an embodiment, the invention provides a fabrication method compatible with conventional process and equipment. In a specific embodiment, dummy structures underlying a inductor are removed to reduce a capacitance. According to embodiments of the invention, no additional process for patterning the dummy structures is needed since it shares the same processes as those for interconnect metal layers formation. In alternative embodiments, the invention provides a method applicable to reducing parasitic capacitance of other integrated circuit components such as interconnect structures. These and other benefits are described throughout the present specification and more particularly below.

DETAILED DESCRIPTION OF THE INVENTION

Figures 1A, 1B:
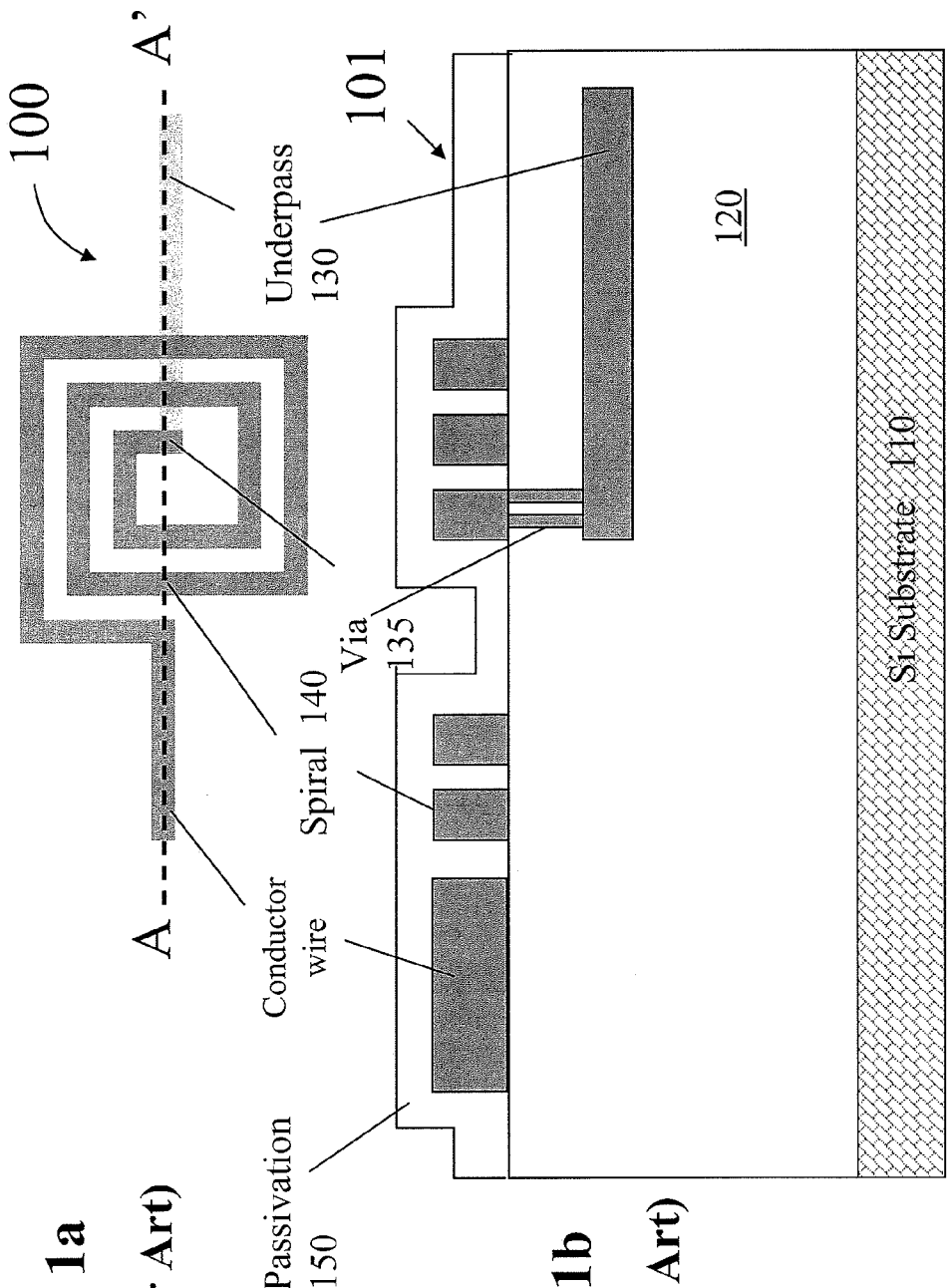
FIG. 1a is a top-view diagram of a conventional integrated circuit inductor.
FIG. 1b is a cross-sectional view diagram along AA' of a conventional integrated inductor of FIG. 1.

According to the present invention, techniques directed to integrated circuits and their processing are provided for the manufacture of semiconductor devices. More particularly, embodiments of the present invention provide methods of fabricating an integrated inductor having an underlying cavity to reduce parasitic capacitance. Merely by way of example, embodiments of the invention have been applied to forming a high Q inductor on a silicon substrate. But it would be recognized that the invention has a much broader range of applicability. For example, the invention can be applied to integrated circuits including CMOS devices, SOI devices, bipolar devices, or BiCMOS devices. The invention can also be applied to reducing parasitic capacitance of other circuit elements such as interconnect structures. The invention can also be used with other integrated circuit substrates such as compound semiconductors.

Depending upon the embodiment, the present invention includes various features, which may be used. These features include the following:

1. A high performance integrated inductor having reduced parasitic capacitance and a high Q factor;
2. A fabrication method compatible with conventional process and equipment;
3. No additional process for patterning dummy metal structures is needed since it shares the same process as interconnect metal layers; and
4. A method applicable to reduce parasitic capacitance of other integrated circuit components such as interconnect structures.

As shown, the above features may be in one or more of the embodiments to follow. These features are merely examples, which should not unduly limit the scope of the claims herein. One of ordinary skill in the art would recognize many variations, modifications, and alternatives.

A method for fabricating an integrated circuit inductor device according to an embodiment of the present invention may be outlined as follows:

1. Providing silicon substrate (step 210);
2. Forming insulating layer including a dummy structure (step 220);
3. Forming an inductor overlying the dummy structure, the inductor having a first portion and a second portion (step 230);
4. Exposing the dummy structure by forming an opening in the insulating layer (step 240);
5. Removing the dummy structure to form a cavity underlying the inductor (step 250); and
6. Performing backend processes (step 260).

The above sequence of steps provides a method for fabricating an integrated inductor device according to an embodiment of the present invention. As shown, the method uses a combination of steps including a way of forming a cavity underlying the inductor to reduce interaction between the substrate and the integrated inductor. Other alternatives can also be provided where steps are added, one or more steps are removed, or one or more steps are provided in a different sequence without departing from the scope of the claims herein. Further details of the present method can be found throughout the present specification and more particularly below.

Figure 2:
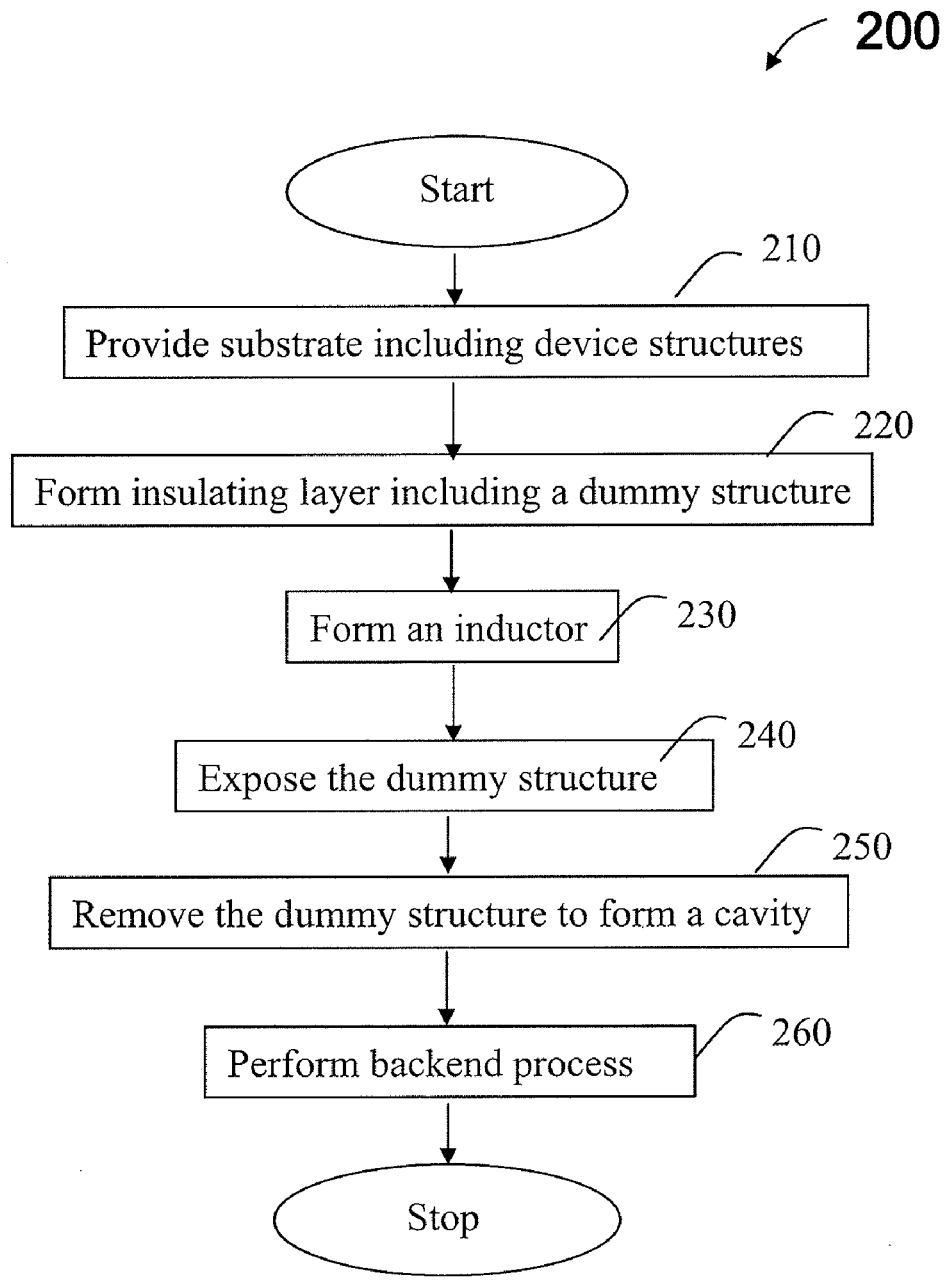
FIG. 2 is a simplified flow diagram of a method of fabricating an integrated inductor device according to an embodiment of the present invention.

FIG. 2 is a simplified flow diagram of a method 200 of fabricating an integrated inductor device according to an embodiment of the present invention. This diagram is merely an example, which should not unduly limit the scope of the claims herein. One of ordinary skill in the art would recognize other variations, modifications, and alternatives. A specific embodiment of the method is now discussed below with reference to FIGS. 3-7.

Figure 3:
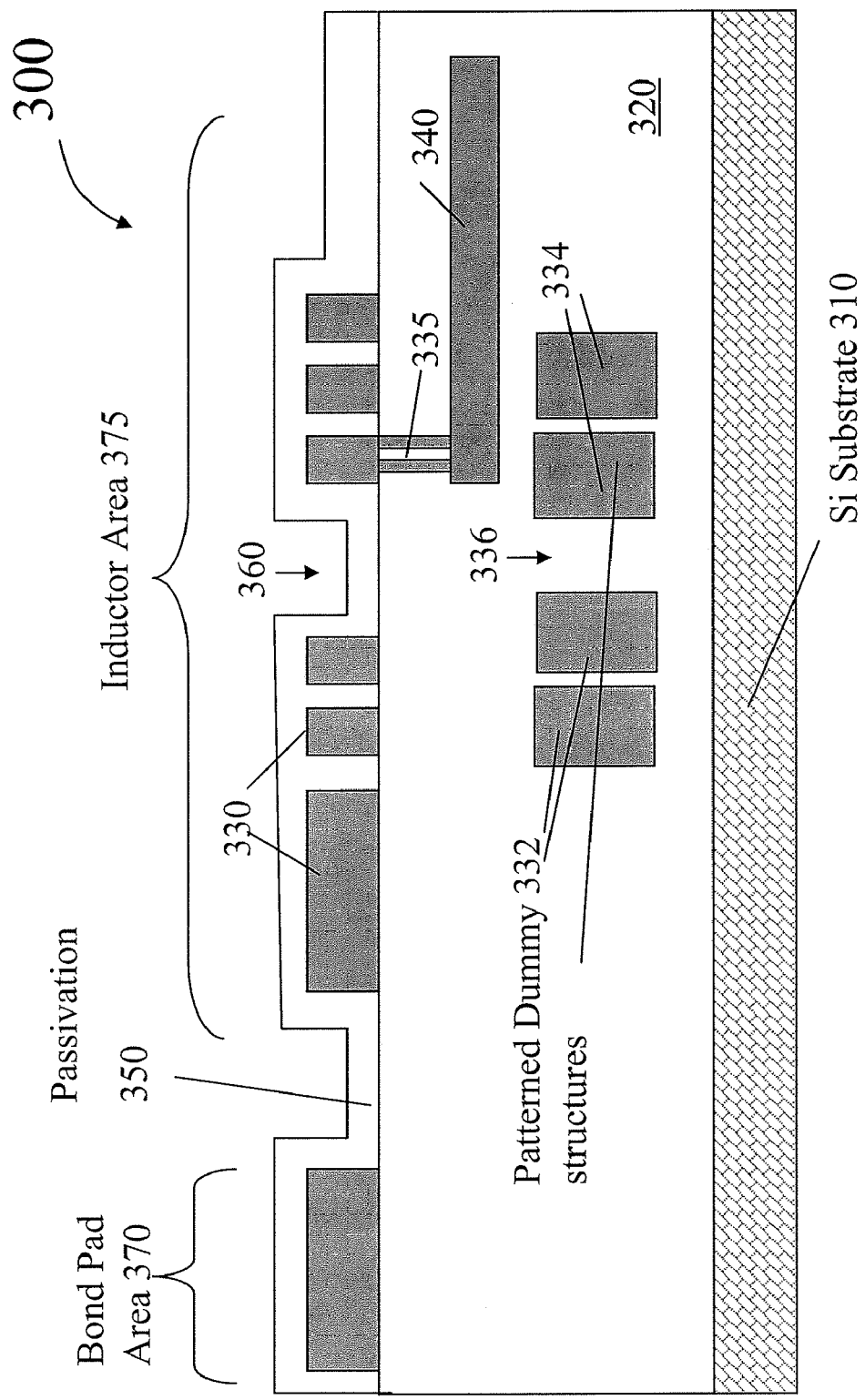
FIG. 3 is a simplified cross-sectional view diagram of a device structure illustrating a method of fabricating an integrated inductor device according to an embodiment of the present invention.

FIG. 3 is a simplified cross-sectional view diagram of a device structure 300 for illustrating a method of fabricating an integrated inductor device according to an alternative embodiment of the present invention. This diagram is merely an example, which should not unduly limit the scope of the claims herein. One of ordinary skill in the art would recognize other variations, modifications, and alternatives. As shown, the method according to a specific embodiment includes providing a semiconductor substrate (step 210 in FIG. 2). Referring to FIG. 3, the method provides a substrate 310. In a specific embodiment, substrate 310 is a silicon wafer. Depending upon the embodiments, substrate 310 can include integrated circuit devices fabricated in a semiconductor substrate and various device structures formed on the substrate. For example, the inductor can be formed over various CMOS, BiCMOS, Bipolar, SiGe, or SOI devices and circuit components according to an embodiment of the present invention. In other embodiments, the inductor can be formed adjacent to various devices and circuit components. In some embodiments, the devices and circuit components are for applications in oscillators, amplifiers, matching networks of wireless communication devices such as cellular transceivers, wireless LAN transceivers (e.g., IEEE 802.11), Bluetooth, WiMAX, wireless personal area networks (e.g., IEEE 802.15.4) and others.

In step 220, the method includes forming an insulating layer including a dummy structure. As shown in FIG. 3, insulating layer 320 is provided according to an embodiment of the invention. A portion of the insulating layer having a thickness overlies the substrate in a specific embodiment. In an embodiment, insulator layer 320 is an interlayer dielectric layer including a doped glass material, such as a BPSG, FSG, and others. The method also includes forming a dummy structure within a portion of the thickness of the insulating layer. As shown in FIG. 3, portions of the dummy structure are labeled 332 and 334 in a specific embodiment. The dummy structures include materials that can be removed in a subsequent process. In a preferred embodiment, the dummy structures include materials that have suitable etch selectivity versus the insulating layer 320. Merely as an example, the dummy structures can include a metal, such as aluminum, copper, or the like. According to embodiments of the present invention, the shape and size of the dummy structures are selected so as not to cause a collapse of the inductor after the dummy structures are removed. In certain specific embodiments, the size and shape of the dummy structures are selected to allow a liquid etchant to etch the dummy structures and to allow etch by-products to be removed from the inductor device. Of course, there can be other modifications, variations and alternatives.

According to a specific embodiment of the present invention, the dummy structures are of metal material. In an embodiment, the dummy structures are formed in the same process steps as those used in forming interconnect structures for an integrated circuit device. In alternative embodiments, the dummy structures can be formed in process steps separate from those used in forming interconnect structures in an integrated circuit device.

In step 230, the method forms an inductor device. Referring to FIG. 3, the method includes forming an inductor having a first portion 330 and a second portion 340. The method also includes forming a connecting portion 335 which connects the first portion with the second portion. In an embodiments, the first portion, the second portion, and the connecting portion are formed using a conducting material. In a specific embodiment, the conducting material is metal, e.g. aluminum, copper, or the like. In an embodiment, the first portion of the inductor includes a conducting coil having a suitable number of turns. In an embodiment, the coil may include 3 to 5 octagonal-shaped turns. In another embodiment, the suitable number of turns may include any integer number of turns and/or any suitable fraction of a turn. In yet another embodiment, the turns may have any suitable shape such as hexagonal, rectangular, circular, or square-shape, so that when a current flows through the turns, they form a magnetic inductance.

In a specific embodiments, the coil of the inductor includes conducting lines having a width of about 10-30 um. In another embodiment, the inductor may include conducting lines having any suitable number of turns and dimensions (width, thickness, length, and spacing between the turns). In a specific embodiment, the connecting portion 335 is formed using a via formation process. In an embodiment of the present invention, a boning pad 370 may be formed at the same time as the forming of the inductor. In an embodiment, the inductor has a center portion, e.g. 360, aligned to a portion of the dummy structure, e.g. 336, to facilitator the removal of the dummy structure material. The method further includes applying a passivation layer 350 over the integrated inductor and the bonding pad. Of course, there can be other variations, modifications, and alternatives.

Figure 4:
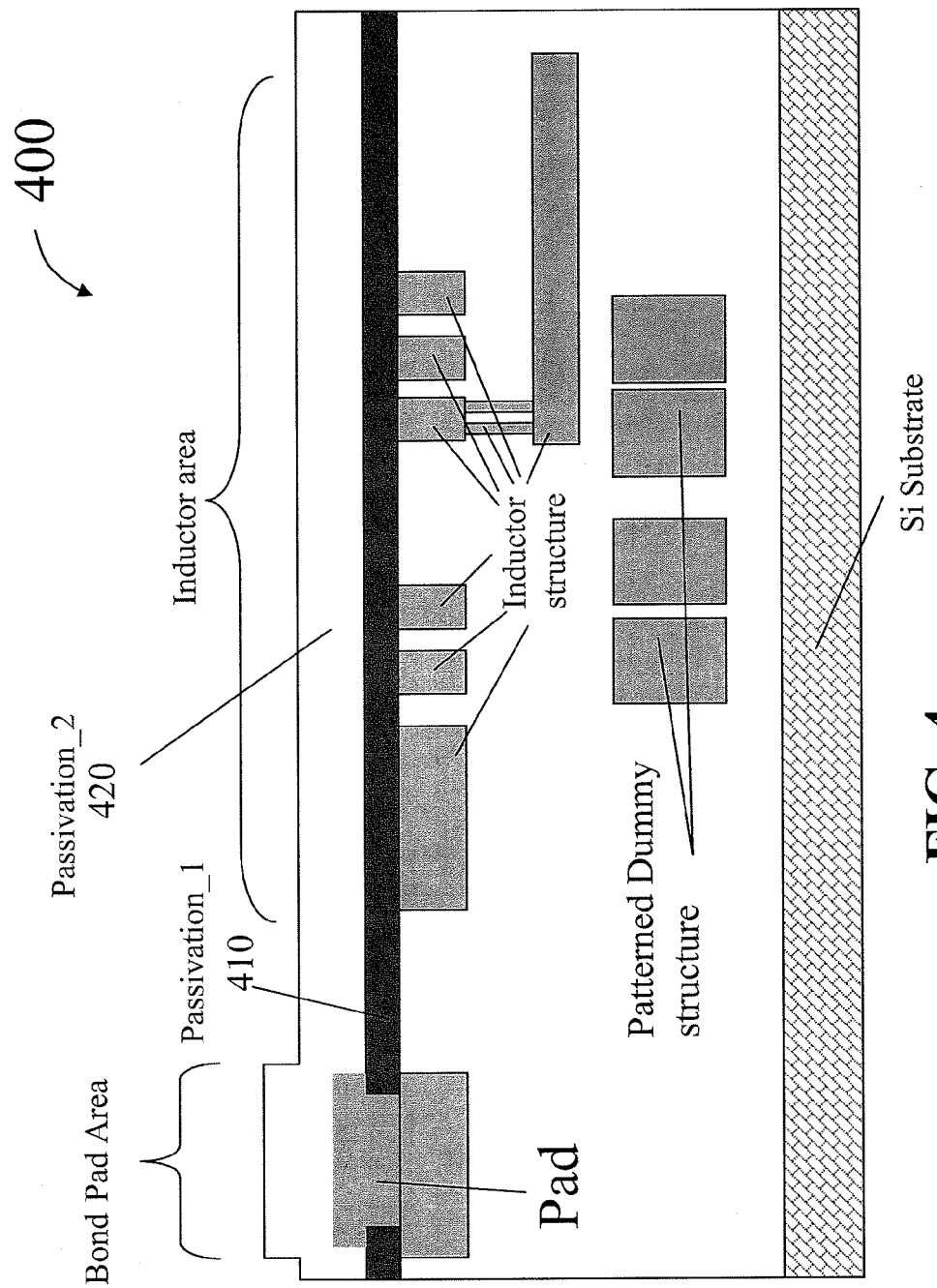
FIG. 4 is a simplified cross-sectional view diagram of a device structure illustrating a method of fabricating an integrated inductor device according to an alternative embodiment of the present invention.

FIG. 4 is a simplified cross-sectional view diagram of a device structure 400 illustrating a method of fabricating an integrated inductor device according to an alternative embodiment of the present invention. This diagram is merely an example, which should not unduly limit the scope of the claims herein. One of ordinary skill in the art would recognize other variations, modifications, and alternatives. As shown, the method includes providing a silicon substrate and forming an insulating layer overlying the silicon substrate; the insulation layer includes a thickness and a patterned dummy structure within the thickness. The method further includes forming an inductor structure overlying a region of the insulating layer and overlying the patterned dummy structure. In an embodiment, the method also includes forming a bonding pad structure. The method also includes forming a first passivation layer Passivation_1 410 overlying the inductor structure while exposing a portion of the bonding pad structure. The method further includes forming a second passivation layer Passivation_2 420 over the inductor structure and the expose bonding pad structure. According to a specific embodiment of the invention, the passivation layers Passivation_1 410 and Passivation_2 420 are insulating layers such as silicon nitride or various silicon dioxide based dielectrics. In an embodiment, the method shown in FIG. 4 can be used when the inductor and/or the dummy structure are formed using a copper material. Of course, there can be other variations, modifications, and alternatives.

Figure 5:
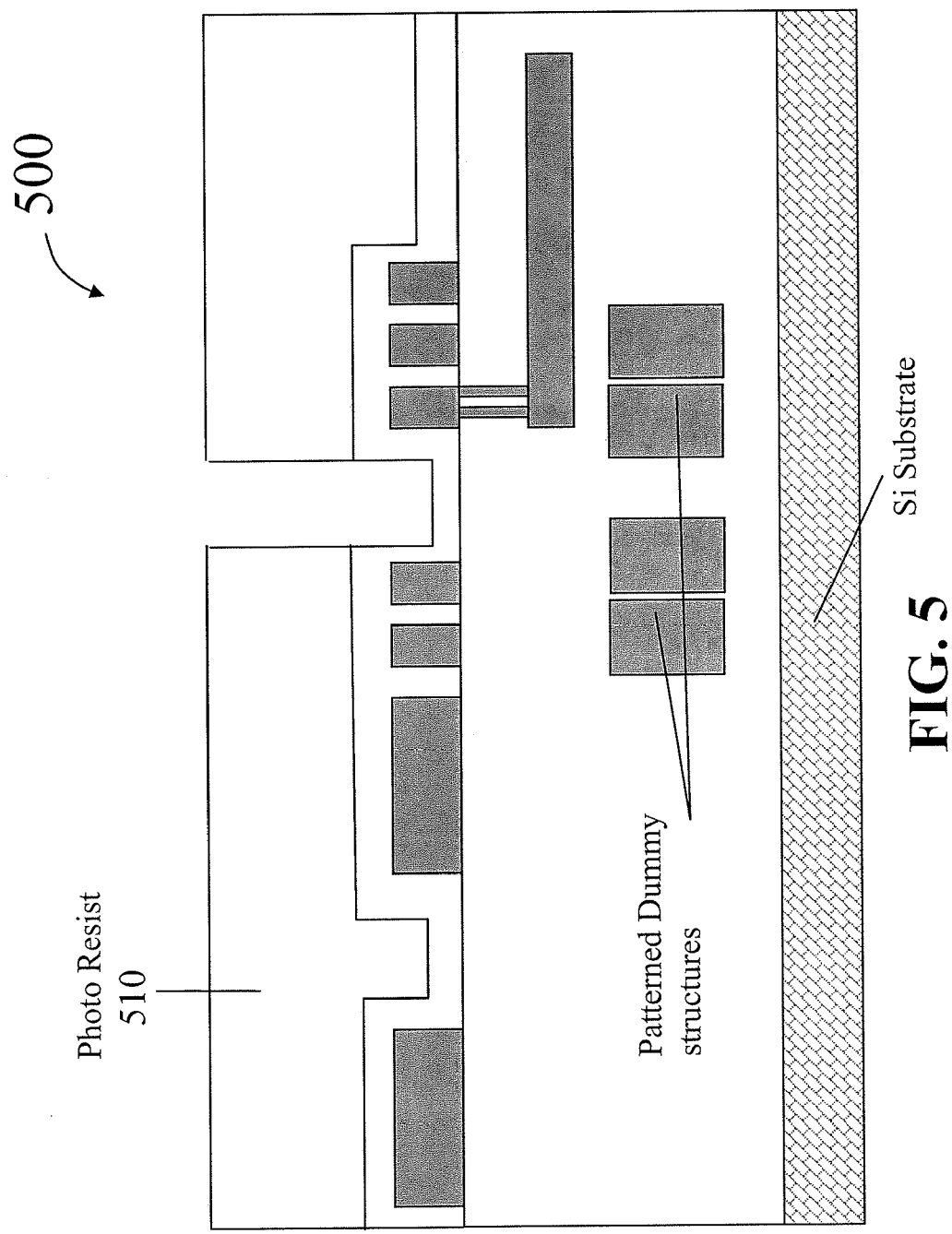
FIG. 5 is a simplified cross-sectional view diagram of a device structure illustrating a method of fabricating an integrated inductor device according to an alternative embodiment of the present invention.

In step 240, the method covers the passivation layer(s) and exposes an area in a center portion of the inductor. FIG. 5 is a simplified cross-sectional view diagram of a device structure 500 for illustrating a method for an integrated inductor according to an alternative embodiment of the present invention. This diagram is merely an example, which should not unduly limit the scope of the claims herein. One of ordinary skill in the art would recognize other variations, modifications, and alternatives. As shown, the method according to a specific embodiment includes forming a photo resist layer 510 that overlies the inductor device structures. The method patterns the photo resist to expose only an area that is smaller than an open portion in the center of the inductor's coil structure. In an embodiment, the area is aligned with a portion of the dummy layer. Of course, there can be other variations, modifications, and alternatives.

In step 250, the method removes the dummy structures according to a specific embodiment of the present invention. In an embodiment, the method includes removing the dummy structures to form a cavity underlying the inductor to reduce a dielectric constant to ranging from about 4 to 1 to reduce parasitic capacitance and to increase a Q value of the inductor. In some embodiments, the cavity comprises a plurality interconnected chambers that are formed from the patterned dummy structures.

Figure 6:
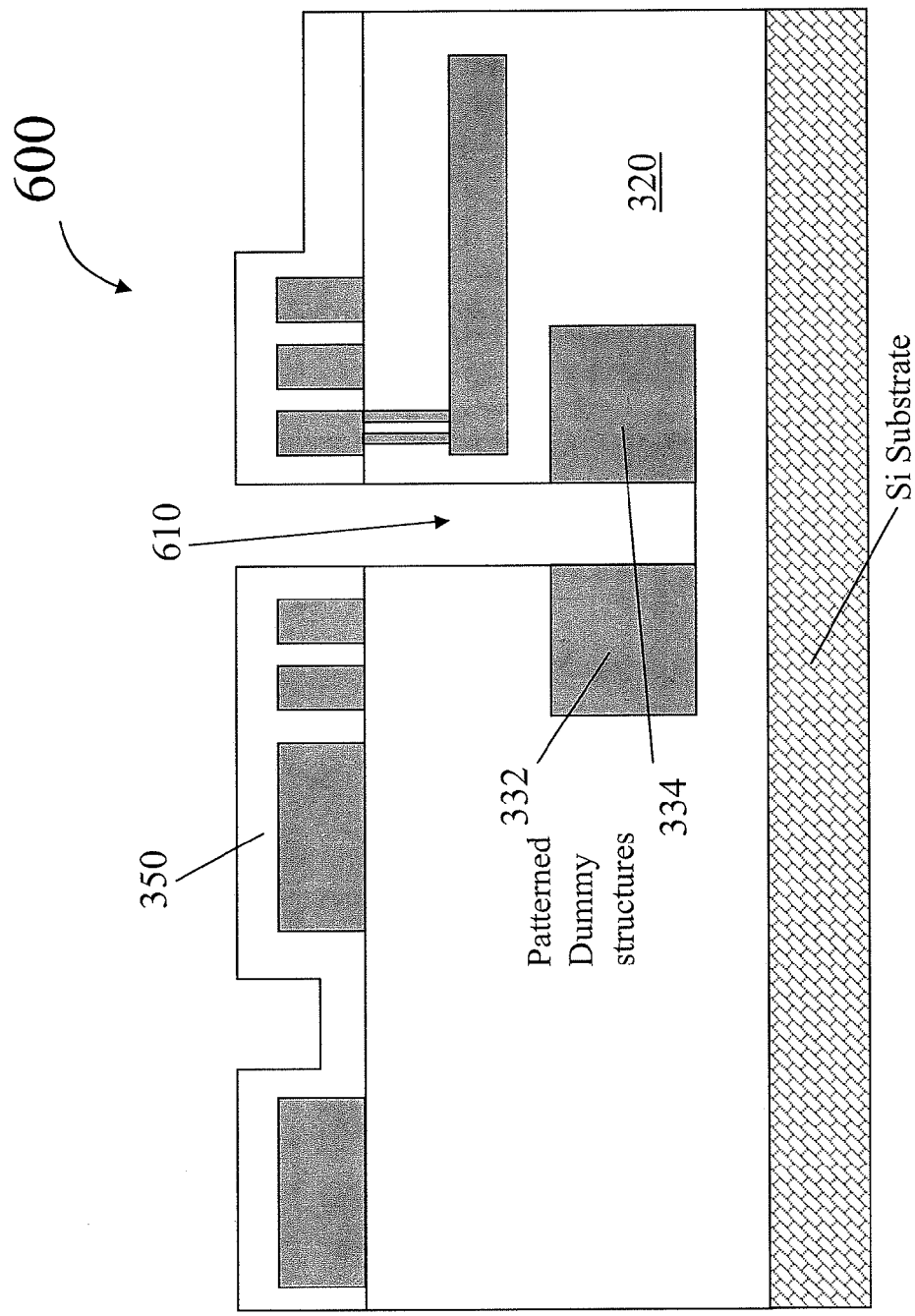
FIG. 6 is a simplified cross-sectional view diagram of a device structure illustrating a method of fabricating an integrated inductor device according to an embodiment of the present invention.

FIG. 6 is a simplified cross-sectional view diagram of a device structure 600 for illustrating a method for an integrated inductor device according to an embodiment of the present invention. This diagram is merely an example, which should not unduly limit the scope of the claims herein. One of ordinary skill in the art would recognize other variations, modifications, and alternatives. As shown, the method according to a specific embodiment includes removing a portion of passivation layer 350 and a portion of insulator layer 320 to form an opening 610, which exposes parts of dummy structures 332 and 334. According to embodiments of the invention, the method then removes the dummy structures to form cavities underlying the inductor. In a specific embodiment, the dummy structures are formed using metals. In an embodiment, the dummy structures are removed using a wet metal etchant, for example, oxidant, acid, and/or chelator, etc. In certain embodiments, the etchant is selected to have an etch selectivity of metal versus insulator. In specific embodiments, the size and shape of the dummy structures are selected such that when the dummy structures are removed, the remaining insulator layer forms an adequate support for the inductor device, and does not cause the inductor device to collapse. Of course, there can be other variations, modifications, and alternatives. Of course, there can be other variations, modifications, and alternatives.

Figure 7:
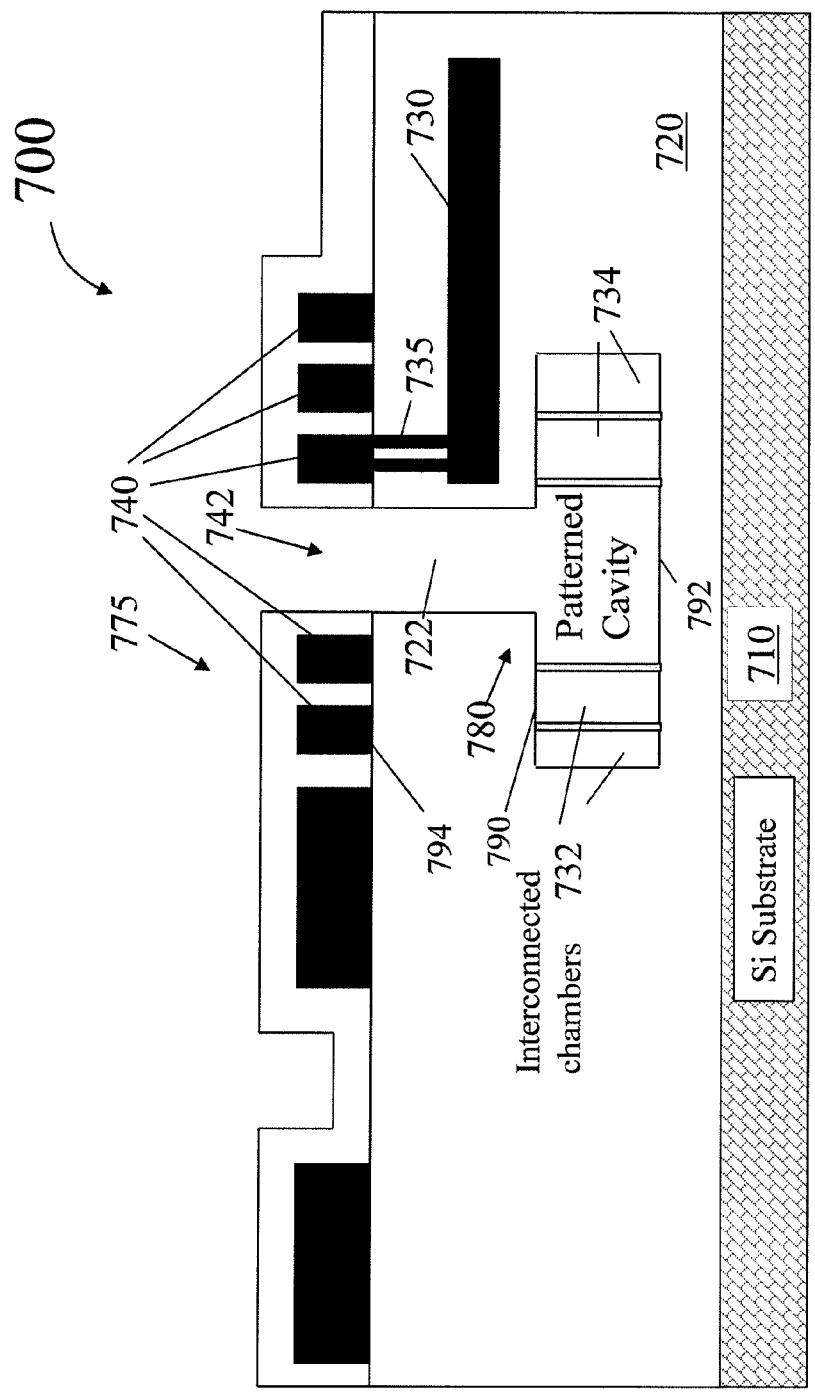
FIG. 7 is a simplified cross-sectional view diagram of a device structure illustrating a method of fabricating an integrated inductor device according to an embodiment of the present invention.

FIG. 7 is a simplified cross-sectional view diagram of a device structure 700 for illustrating a method for an integrated circuit inductor device according to an embodiment of the present invention. This diagram is merely examples, which should not unduly limit the scope of the claims herein. One of ordinary skill in the art would recognize other variations, modifications, and alternatives. As shown, device structure 700 according to a specific embodiment includes an inductor having an underlying cavity. The cavity can be patterned to provide support to the overlying inductor and to prevent the inductor from collapsing. For example, integrated circuit inductor device 700 includes a silicon substrate 710, and an insulating layer 720 overlying the silicon substrate, the insulating layer has a thickness. Device structure 700 also includes an inductor 775 overlying a portion of the thickness of the insulating layer. Inductor 775 includes a first portion 740 and a second portion 730. First portion 740 may include a spiral coil having a number of turns, all located on a surface of the insulator layer. The spiral coil has a surface area overlying the patterned cavity. One terminal of the coil is connected to the second portion 730 through a via 735. Device structure 700 further includes a cavity 780 within a portion of the thickness of the insulating layer and underlying the inductor. In a specific embodiment, the cavity includes an opening 722 in the insulator layer and a plurality of interconnected chambers, e.g., 732 and 734, in the insulator layer. In a particular embodiment, the opening 722 in the insulator layer is aligned with a center portion 742 of the spiral coil. In a specific embodiment, the cavity has a height of about 0.5 micron to about 2.0 microns measured from the bottom 792 of the interconnected chambers to the top 790 of the interconnected chambers. In another embodiment, the distance from the top of the cavity (i.e., the top of the interconnected chambers) to a bottom 794 of the inductor coil is about 2 microns to about 6 microns. The cavity includes a top surface area 790 and a bottom surface area 792. In an embodiment, the bottom surface area 792 is equal to the top surface area 790 together with an area of the opening 722. In another embodiment, the bottom surface area may be smaller than the top surface area 790 and the surface area of the opening 722. In a specific embodiment, the top surface area 790 together with the area of the opening 722 is 1.1 times to 1.5 times greater than the surface area of the spiral coil. Of course, one of ordinary skill in the art will recognize other variations, modifications, and alternatives.

In step 260, the method performs backend processes. In a specific embodiment, the method use conventional backend processes for integrated circuit devices. The back processes can include, for example, passivation patterning for an aluminum process and/or additional passivation patterning for a Cu process. The backend process can also include an alloy anneal process.

The above sequence of steps provides a method for an integrated inductor having a high Q factor according to an embodiment of the present invention. As shown, the method uses a combination of steps including a way of forming a cavity structures underlying an inductor to reduce parasitic capacitance. Other alternatives can also be provided where steps are added, one or more steps are removed, or one or more steps are provided in a different sequence without departing from the scope of the claims herein.

Figure 8:
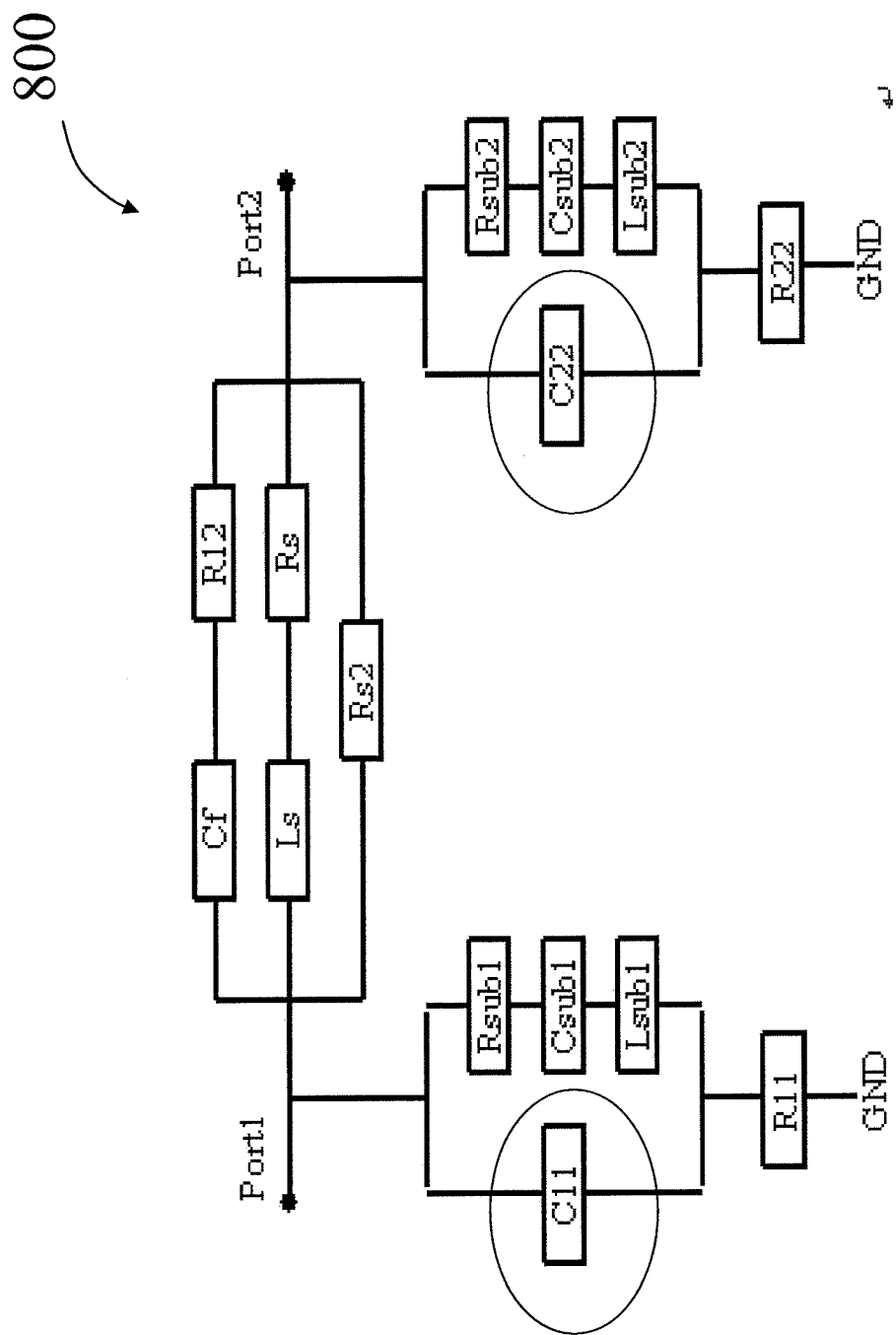
FIG. 8 is a simplified schematic diagram of an integrated inductor device according to an embodiment of the present invention.

FIG. 8 is a simplified schematic diagram of an integrated circuit inductor device 800 according to an embodiment of the present invention. This diagram is merely examples, which should not unduly limit the scope of the claims herein. One of ordinary skill in the art would recognize other variations, modifications, and alternatives. As shown, inductor device 800 includes an inductor that includes inductor Ls, capacitor Cf, and resistors R12, Rs, and Rs2 between Port1 and Port 2. Between Port1 and GND are parasitic elements including C11, Rsub1, Csub1, Lsub1, and R11. Between Port2 and GND are parasitic elements including C22, Rsub2, Csub2, Lsub2, and R22. As noted, C11 and C22 represent parasitic capacitive elements between the inductor and the substrate. The capacitance is largely determined by a dielectric constant of the insulating layer between the inductor and the substrate. A typical insulator can have a dielectric constant about 4, resulting in substantial parasitic capacitance in the inductor device. Since the ambient air in the cavity underlying the inductor has a dielectric constant of about 1, as opposed to a dielectric constant of about 4. The cavity is configured to reduce a dielectric constant from about 4 to 1, and thus resulting in a reduced parasitic capacitance and an increase of the Q factor of the inductor. Of course, with certain insulators having dielectric constant lower than 4, e.g. 2 or 3, the cavity will accordingly reduce a dielectric constant from about 2 or 3 to 1 for an increase of the Q factor of the inductor.

It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An integrated inductor comprising:
   a silicon substrate;
   an insulating layer overlying the silicon substrate, the insulating layer having a thickness;
   an inductor overlying a region of the insulating layer, the inductor having a first portion and a second portion;
   a cavity within a portion of the thickness of the insulating layer and underlying the inductor, the cavity having a patterned structure; and
   an opening in the insulating layer, the opening being coupled to the cavity;
   wherein the first portion of the inductor includes a coil,
   wherein the cavity is configured to reduce a parasitic capacitance and increase a Q value of the inductor,
   wherein the patterned structure comprises a plurality of interconnected chambers disposed in the insulating layer, and wherein the opening in the insulating layer is aligned with a center portion of the coil.

2. The integrated inductor of claim 1, wherein the coil comprises a number of turns ranging from about 3 to 5.

3. The integrated inductor of claim 1, wherein the inductor comprises metal lines characterized by a width of about 10 to 30 microns.

4. The integrated inductor of claim 1, wherein the silicon substrate comprises CMOS devices, SOI devices, bipolar devices, or BiCMOS devices.

5. The integrated inductor of claim 1, wherein the cavity is formed after the formation of the inductor.

6. The integrated inductor of claim 5, wherein the cavity is formed by removing a portion of the insulating layer and removing a dummy structure within the thickness of the insulating layer.

7. The integrated inductor of claim 1, wherein the cavity comprises a height of about 0.5 micron to about 2.0 microns.

8. The integrated inductor of claim 1, wherein the cavity comprises a top surface area that is spaced about 2 microns to about 6 microns from a bottom surface area of the coil.

9. The integrated inductor of claim 1, wherein the cavity comprises a top surface area and a bottom surface area.

10. The integrated inductor of claim 9, wherein the top surface area and the bottom surface area have a same size.

11. The integrated inductor of claim 9, wherein the top surface area is greater than the bottom surface area.

12. The integrated inductor of claim 9, wherein the patterned structure provides mechanical support to the coil.

* * * * *